United States Patent
Takizawa et al.

(10) Patent No.: US 7,269,060 B2
(45) Date of Patent: Sep. 11, 2007

(54) MAGNETIC RANDOM ACCESS MEMORY

(75) Inventors: Ryousuke Takizawa, Naka-gun (JP); Kenji Tsuchida, Kawasaki (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/298,597

(22) Filed: Dec. 12, 2005

(65) Prior Publication Data

US 2007/0030726 A1 Feb. 8, 2007

(30) Foreign Application Priority Data

Aug. 2, 2005 (JP) ............... 2005-224310

(51) Int. Cl.
*G11C 11/00* (2006.01)
(52) U.S. Cl. .................. 365/158; 365/230.06
(58) Field of Classification Search ............... 365/158, 365/230.06, 189.09
See application file for complete search history.

(56) References Cited

U.S. PATENT DOCUMENTS

2004/0125647 A1* 7/2004 Tsuchida et al. ............ 365/158
2005/0157541 A1* 7/2005 Iwata ......................... 365/158

FOREIGN PATENT DOCUMENTS

JP 2004-213771 7/2004

OTHER PUBLICATIONS

U.S. Appl. No. 11/298,597, filed Dec. 12, 2005, Takizawa et al.
U.S. Appl. No. 11/390,254, filed Mar. 28, 2006, Inaba et al.
U.S. Appl. No. 11/065,143, filed Feb. 24, 2005, Inaba.

* cited by examiner

*Primary Examiner*—Vu A. Le
(74) *Attorney, Agent, or Firm*—Oblon, Spivak, McClelland, Maier & Neustadt, P.C.

(57) ABSTRACT

A magnetic random access memory includes first write lines separated from one another and extending along a first direction. Second write lines extend in a direction different from the first direction. The MTJ elements are provided between the first write lines and the second write lines. Connection lines connect the first write lines. Sinkers are connected to ends of the first write lines and to the first write lines at between the connection lines and extract currents from the first write lines. Drivers are connected to ends of the first write lines and supply currents to the first write lines.

20 Claims, 19 Drawing Sheets

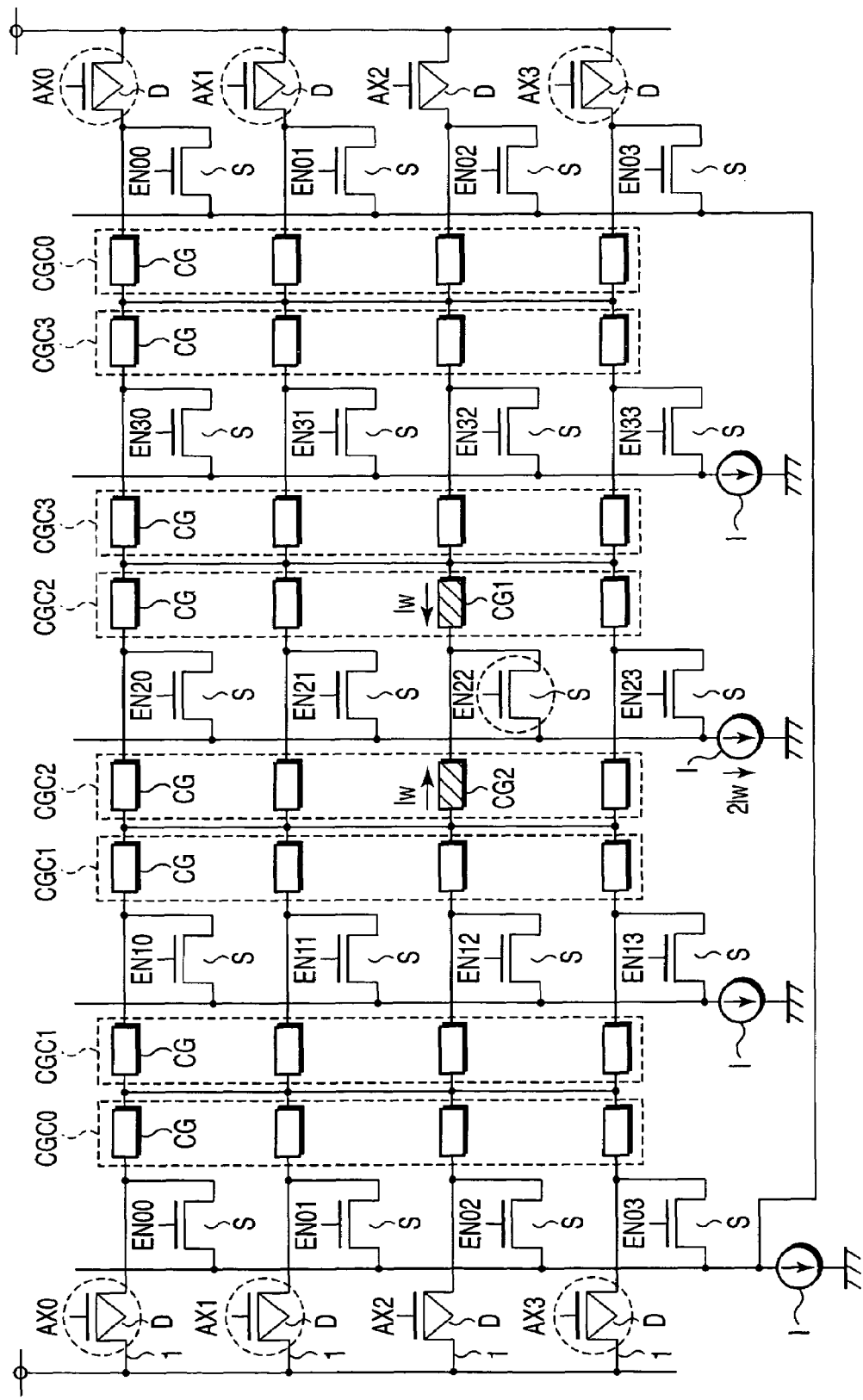
F I G. 11

MAGNETIC RANDOM ACCESS MEMORY

CROSS-REFERENCE TO RELATED APPLICATIONS

This application is based upon and claims the benefit of priority from prior Japanese Patent Application No. 2005-224310, filed Aug. 2, 2005, the entire contents of which are incorporated herein by reference.

BACKGROUND OF THE INVENTION

1. Field of the Invention

The present invention relates to a magnetic random access memory, more specifically, for example, to arrangements of drivers and sinkers of a magnetic random access memory, and a decoding system.

2. Description of the Related Art

A magnetic random access memory (MRAM) is a memory device in which "1" or "0" information is stored using a magnetoresistive effect, and a ferromagnetic tunneling junction (MTJ) element is used as a memory cell. The MRAM has nonvolatility, high integrating property, high reliability, low power consumption, and high-speed operation and is one of universal memory device candidates.

At present, information is recorded in the memory cell, when a magnetic field is applied to the MTJ element to change a spin direction of a free layer of the MTJ element. The magnetic field is generated by a current which flows through two write lines (bit line, word line) crossing each other at right angles.

Three factors define a maximum value of a scale of one memory cell array. The three factors are an applied potential difference V between opposite-ends of the write line at a writing time, a write current I, and a resistance R of the write line per memory cell. Specifically, assuming that the number of memory cells controlled by one write line is n, a relation equation $V=nRI$ is obtained by Ohm's law. Moreover, the number n of the memory cells is determined depending on the potential difference V, the write current I, and the resistance R.

It is currently difficult to apply high potentials to the opposite ends of a write wire because large write current, for example several mA to 10 mA, is needed and transistors with high withstanding voltage need to be mounted. Therefore, the number n of the memory cells is limited to be small. As a result, a large memory cell array is difficult to achieve.

Reducing resistance of the write line to enlarge the memory cell array is proposed. However, Much larger memory cell array to achieve high integration is needed.

Jpn. Pat. Appln. KOKAI Publication No. 2004-213771 discloses that the write bit line is connected to the MTJ element to reduce a bit line current.

BRIEF SUMMARY OF THE INVENTION

According to a first aspect of the present invention, there is provided a magnetic random access memory comprising: first write lines separated from one another and extending along a first direction; second write lines extending in a direction different from the first direction; MTJ elements provided between the first write lines and the second write lines; connection lines connecting the first write lines; sinkers connected to ends of the first write lines, connected to the first write lines at between the connection lines and extracting currents from the first write lines; and drivers connected to ends of the first write lines and supplying currents to the first write lines.

According to a second aspect of the present invention, there is provided a magnetic random access memory comprising: first write lines separated from one another and extending along a first direction; second write lines extending in a direction different from the first direction; MTJ elements provided between the first write lines and the second write lines; connection lines connecting the first write lines; drivers connected to ends of the first write lines and to the first write lines at between the connection lines and supplying currents to the first write lines; and sinkers connected to ends of the first write lines and extracting currents from the first write lines.

According to a third aspect of the present invention, there is provided a magnetic random access memory comprising: first write lines separated from one another and extending along a first direction; second write lines extending in a direction different from the first direction; MTJ elements provided between the first write lines and the second write lines; connection lines connecting the first write lines; sinkers connected to ends of the first write lines and to the first write lines at between the connection lines and extracting currents from the first write lines; and drivers connected to the connection lines and supplying currents to the first write lines.

BRIEF DESCRIPTION OF THE SEVERAL VIEWS OF THE DRAWING

FIG. 11 illustrates a state when writing to the MRAM according to the first embodiment;

DETAILED DESCRIPTION OF THE INVENTION

Figure 1:
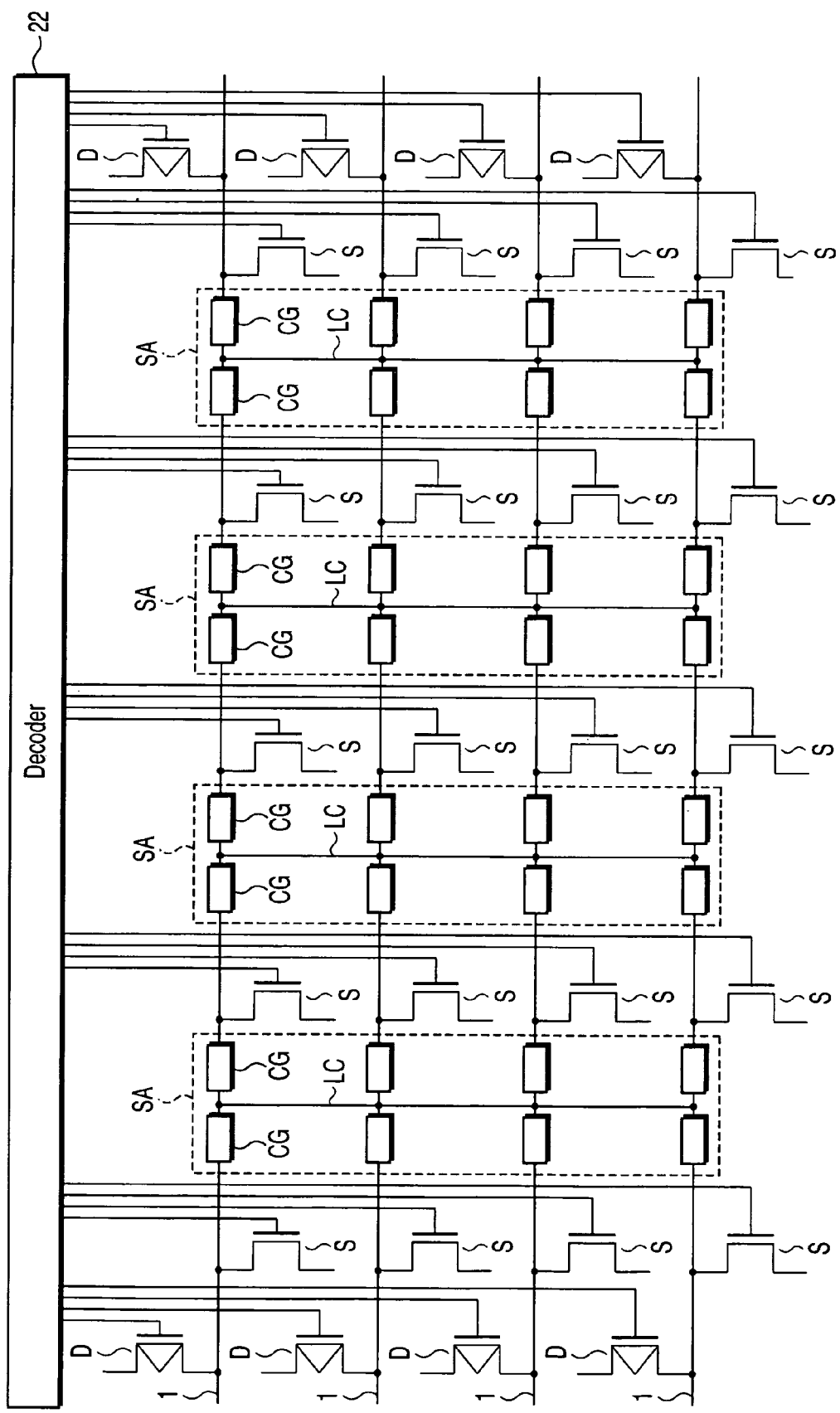
FIG. 1 schematically shows a constitution of a MRAM according to a first embodiment of the present invention.

Embodiments of the present invention will be described hereinafter with reference to the drawings. It is to be noted that in the following description, constituting elements having substantially the same function and constitution are denoted with the same reference numerals, and redundant description is made only if necessary.

First Embodiment

FIG. 1 schematically shows a constitution of a magnetic random access memory (MRAM) according to a first embodiment of the present invention. As shown in FIG. 1, the MRAM has sub-arrays SA. The sub-arrays SA constitute one memory cell array. FIG. 1 shows only one of two types of write lines required for writing in the MRAM.

Figure 2:
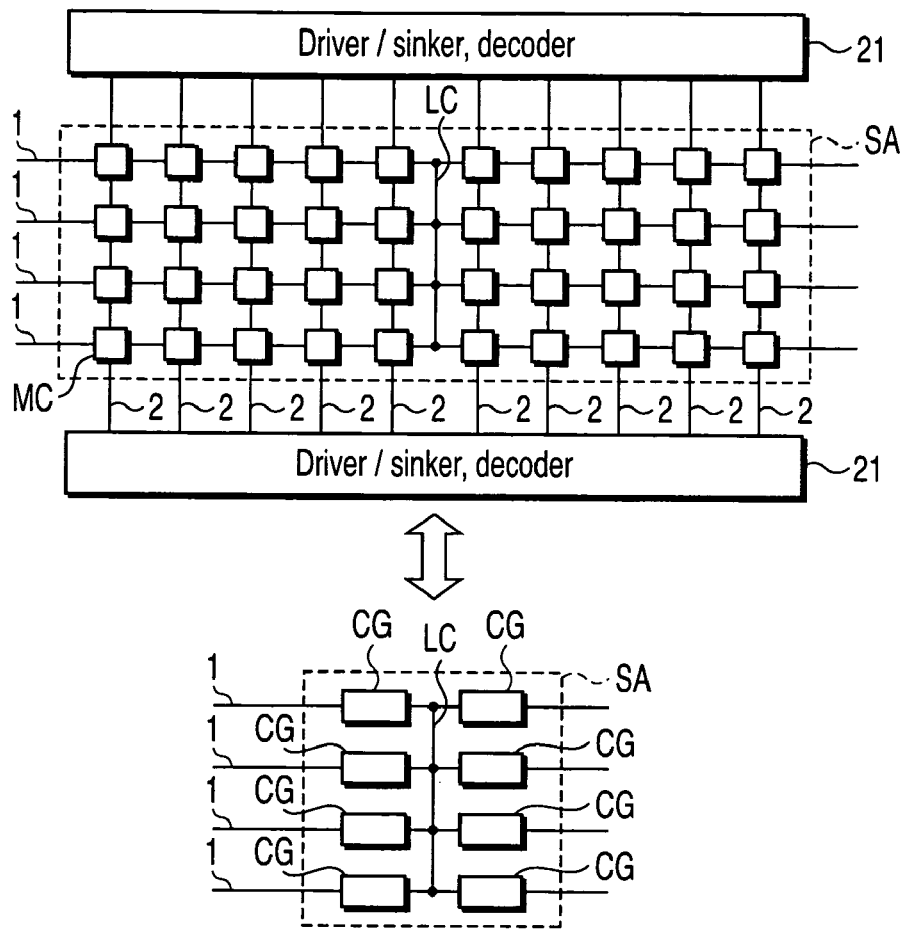
FIG. 2 schematically shows a sub-array of the MRAM according to the first embodiment.

Here, each of the sub-arrays SA has a constitution shown in FIG. 2. FIG. 2 schematically shows the sub-array of the MRAM according to the first embodiment of the present invention. As shown in FIG. 2, memory cells MC are arranged in a matrix form in each sub-array. Each memory cell MC includes an MTJ element.

Figure 3:
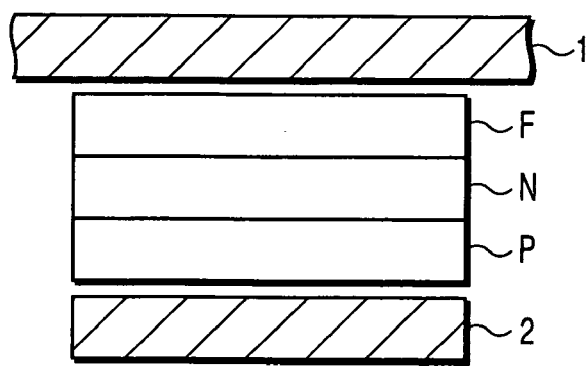
FIG. 3 illustrates a structure of the MTJ element.

As shown in FIG. 3, the MTJ element has at least a pinned layer P, a nonmagnetic layer N, and a recording layer F laminated in order. The pinned layer P is constituted of a ferromagnetic material, and its magnetization direction is pinned. The nonmagnetic layer N is constituted of a non-magnetic material such as an insulating material. The recording layer F is constituted of a ferromagnetic material, and its magnetization direction is variable. A positional relation between the pinned layer P and the recording layer F may be opposite to that shown in FIG. 3. Each of the pinned layer P and the recording layer F may be constituted of sub-layers.

Figure 4:
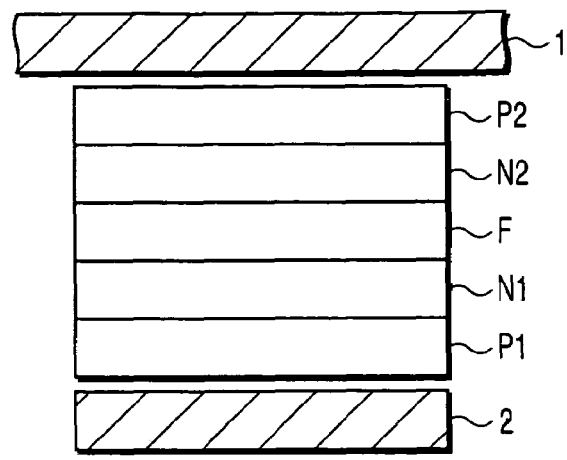
FIG. 4 illustrates a structure of the MTJ element.

Moreover, as shown in FIG. 4, the MTJ element may have a pinned layer P1, a nonmagnetic layer N1, a recording layer F, a nonmagnetic layer N2, and a pinned layer P2 laminated in order. The pinned layers P1, P2 constituted of ferromagnetic materials, and their magnetization directions are pinned in parallel with each other. The nonmagnetic layers N1, N2 are constituted of nonmagnetic materials such as insulating materials. The pinned layers P1, P2 and recording layer F may be constituted of sub-layers.

As shown in FIG. 2, write lines 1 pass above or under the memory cells MC belonging to the same row. A magnetization easy axis direction of the MTJ element constituting the memory cell MC extends along the write line 1. Write lines 2 pass above or under the memory cells MC belonging to the same column. Each memory cell MC is provided between the write line 1 and the write line 2. Upper and lower ends of each memory cell are electrically connected to the write lines 1, 2, or electrically insulated from them depending on the constitution of the memory cell. In each sub-array SA, the write lines 1 are connected to one another via a connection line LC.

Opposite ends of the write line 2 are connected to a driver (current drive circuit)/sinker (current sinker circuit), decoder 21. The driver/sinker, decoder 21 pass currents in both directions extending along the arbitrary write line 2 in response to a control signal supplied from the outside.

Note that in FIG. 1, memory cells are shown as one cell group CG. In FIG. 1, the write lines 2 and the drivers/sinkers, decoders 21 are omitted for simplicity of the drawing.

Figure 5:
FIG. 5 shows a resistance value of a conventional write line.
Figure 6:
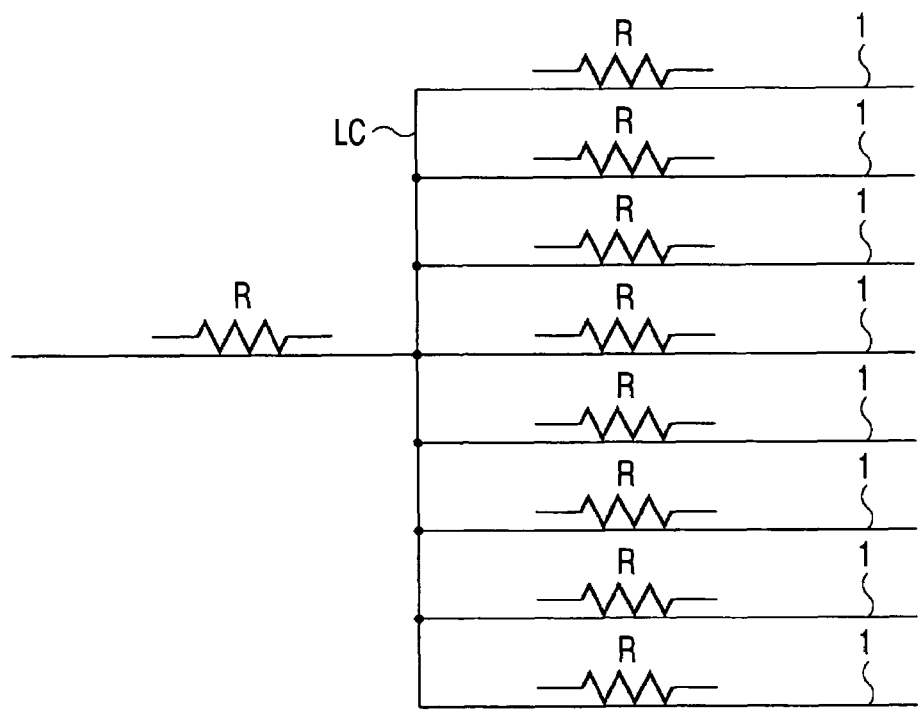
FIG. 6 shows the resistance value of the write line according to the first embodiment.

In each sub-array SA, the write lines 1 are connected together to allow a wiring resistance to decrease. This will be described with reference to FIGS. 5, 6. FIG. 5 shows a resistance value of a conventional write line, and FIG. 6 shows the resistance value of the write line according to the present embodiment. As shown in FIGS. 5, 6, it is assumed that the resistance value from an end of each write line 1 to the connection line LC is R, and the write current is passed through one arbitrary write line 1 on one side (left side in the figure) of the connection line LC as a boundary.

When voltage is applied only to the opposite ends of one write line 1 with no connection line LC provided, as shown in FIG. 5, a combined resistance value of the write line 1 is R+R=2R.

On the other hand, as shown in FIG. 6, when the connection line LC is provided, and the current is passed through one arbitrary write line 1 on one side, potentials are also supplied to all ends on the other side (right side in the figure) of the connection line LC which is the boundary. As a result, the combined resistance value of the circuit of FIG. 6 is R+R/8=1.125R. Note that the wiring resistance of the connection line LC is ignored.

When the write lines 1 other than the write line 1 passing through the selected memory cell are used, and write currents are scattered and passed through them in this manner, an effective wiring resistance can be reduced. Note that when the number of the write lines connected to one another via the connection line is increased, the combined resistance value comes close to R.

As shown in FIG. 1, the respective sub-arrays SA are arranged side by side in the directions in which the write lines 1 extend. Each write line 1 of each sub-array SA is connected to the write line 1 belonging to the same row in the adjacent sub-array SA.

One end of a sinker S is connected to the write line 1 between the sub-arrays SA. The sinker S functions to pass the current in a predetermined direction of the write line 1 when used together with a driver described later, and is constituted, for example, of an n-type metal oxide semiconductor (MOS) transistor. The opposite ends of each write line 1 are connected to one end of the sinker S. Therefore, the sinkers S are connected to each write line 1 at the opposite ends of each sub-array SA. The other end of each sinker S is grounded or connected to a constant-current source as described later. Control signals from a decoder 22 are supplied to the sinkers S, and the sinkers turn on/off in response to the control signals.

Drivers D are connected to the opposite ends of each write line 1. Each driver D is constituted, for example, of a p-type MOS transistor. The driver D turns on/off in response to the signal from a decoder circuit. The other end of each driver D is connected to a power potential supply end or the constant-current source as described later. Control signals from the decoder 22 are supplied to the drivers D, and the drivers turn on/off in response to the control signal.

Figure 7:
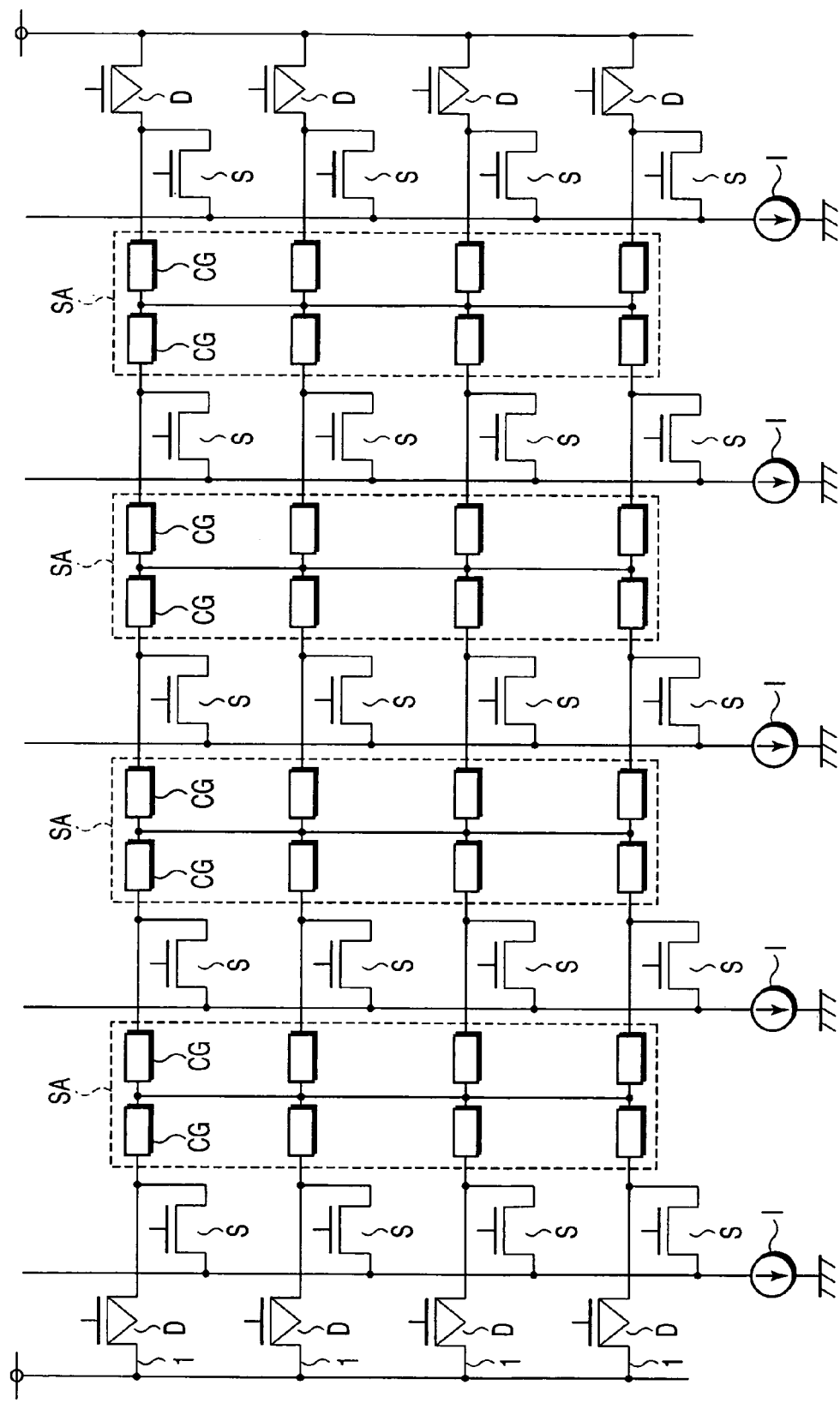
FIG. 7 shows an example in which constant-current sources are provided on a sinker side in the MRAM of the first embodiment.
Figure 8:
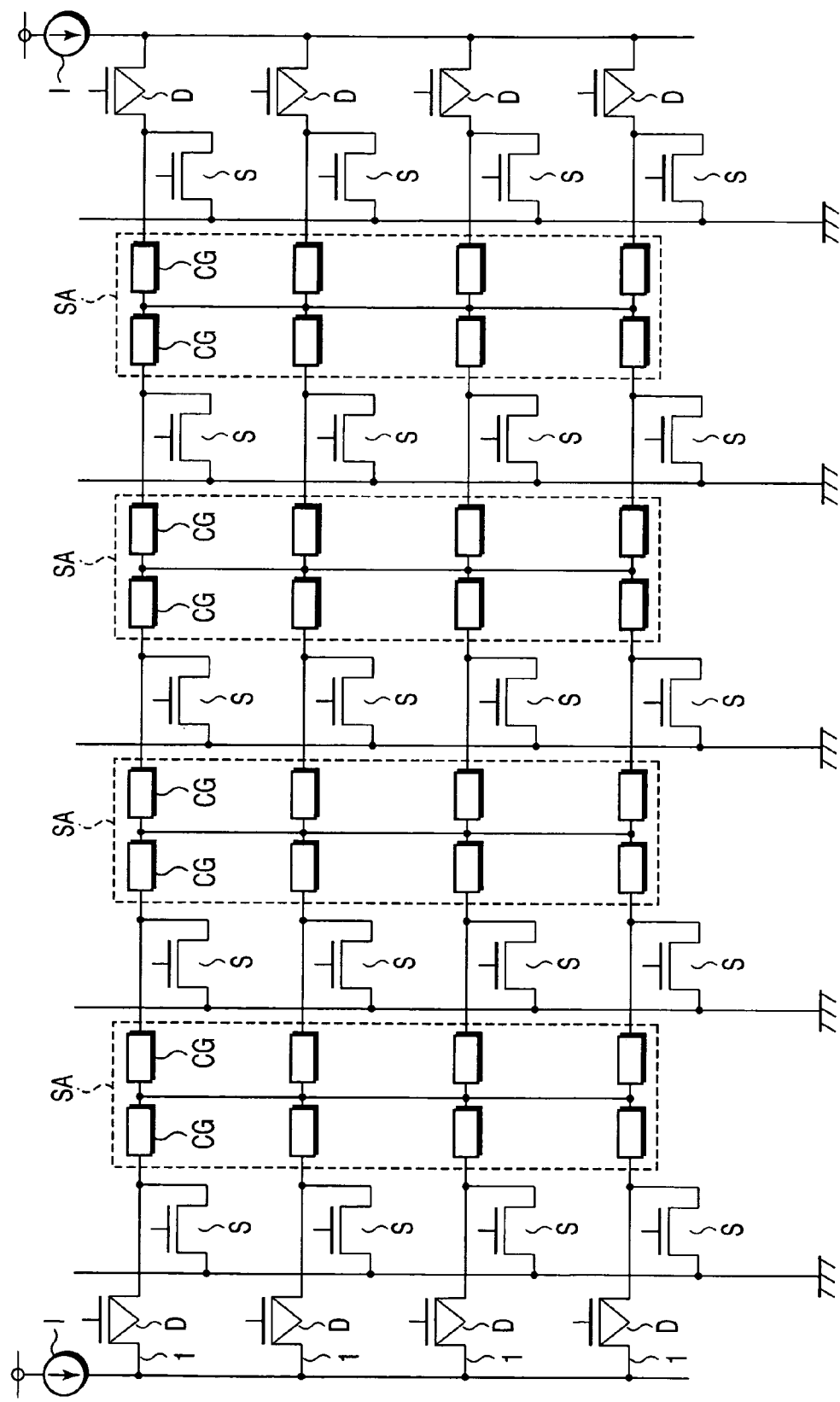
FIG. 8 shows an example in which the constant-current sources are provided on a driver side in the MRAM of the first embodiment.

As shown in FIGS. 7, 8, the other end of each driver or the other end of each sinker is connected to the constant-current source. FIG. 7 shows an example in which constant-current sources are provided on a sinker side in the MRAM according to the first embodiment. As shown in FIG. 7, an end of each sinker S opposite to the write line 1 is grounded via a constant-current source I. An end of each driver D opposite to the write line 1 is connected to the power potential supply end.

On the other hand, FIG. 8 shows an example in which the constant-current sources are provided on a driver side in the MRAM according to the first embodiment. As shown in FIG. 8, the end of each driver D opposite to the write line 1 is connected to the power potential supply end via the constant-current source. The end of each sinker S opposite to the write line 1 is connected to a common potential (ground potential) end.

Figure 9:
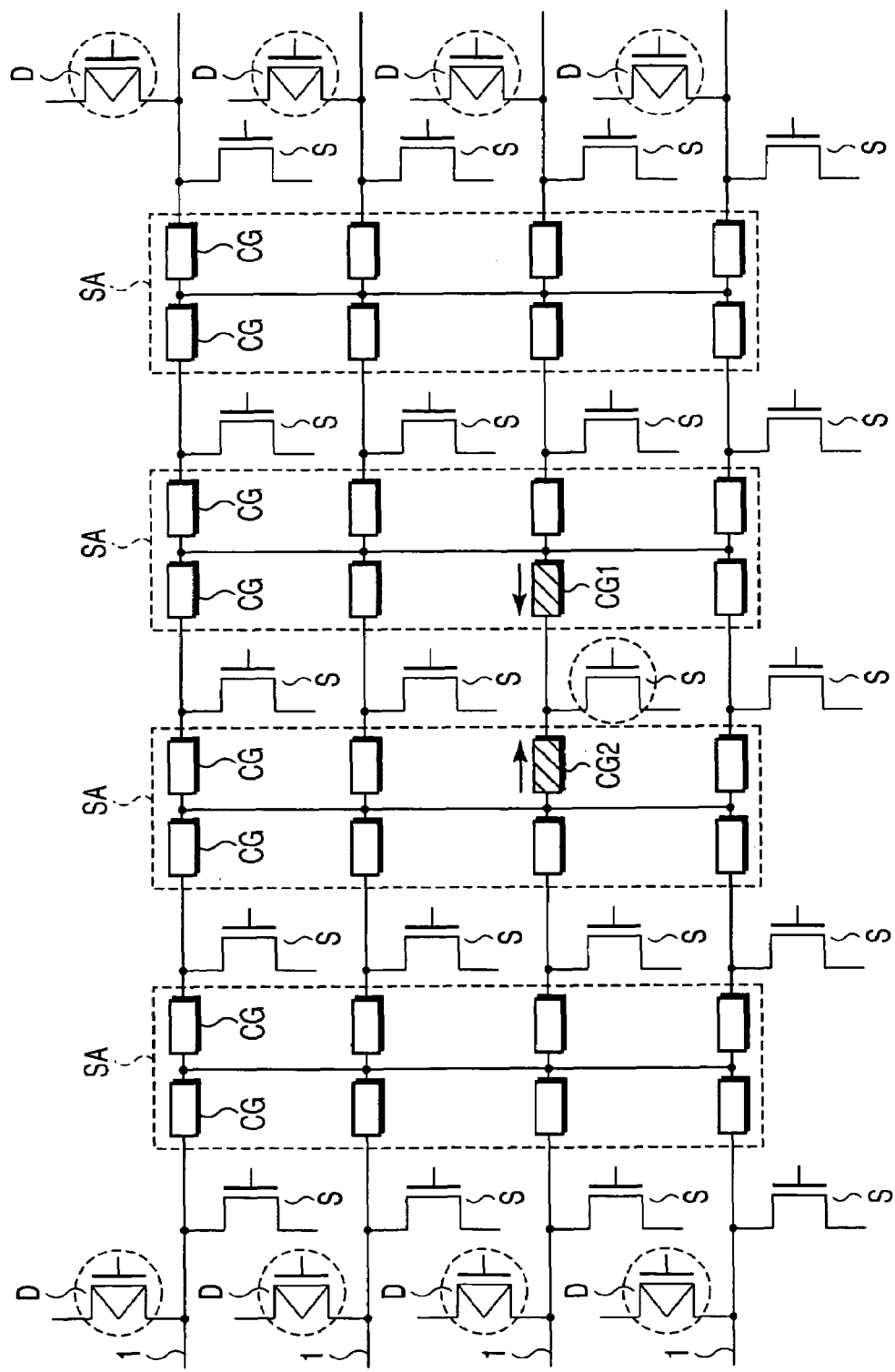
FIG. 9 illustrates a concept of a method of passing a write current through the MRAM of the first embodiment.
Figure 10:
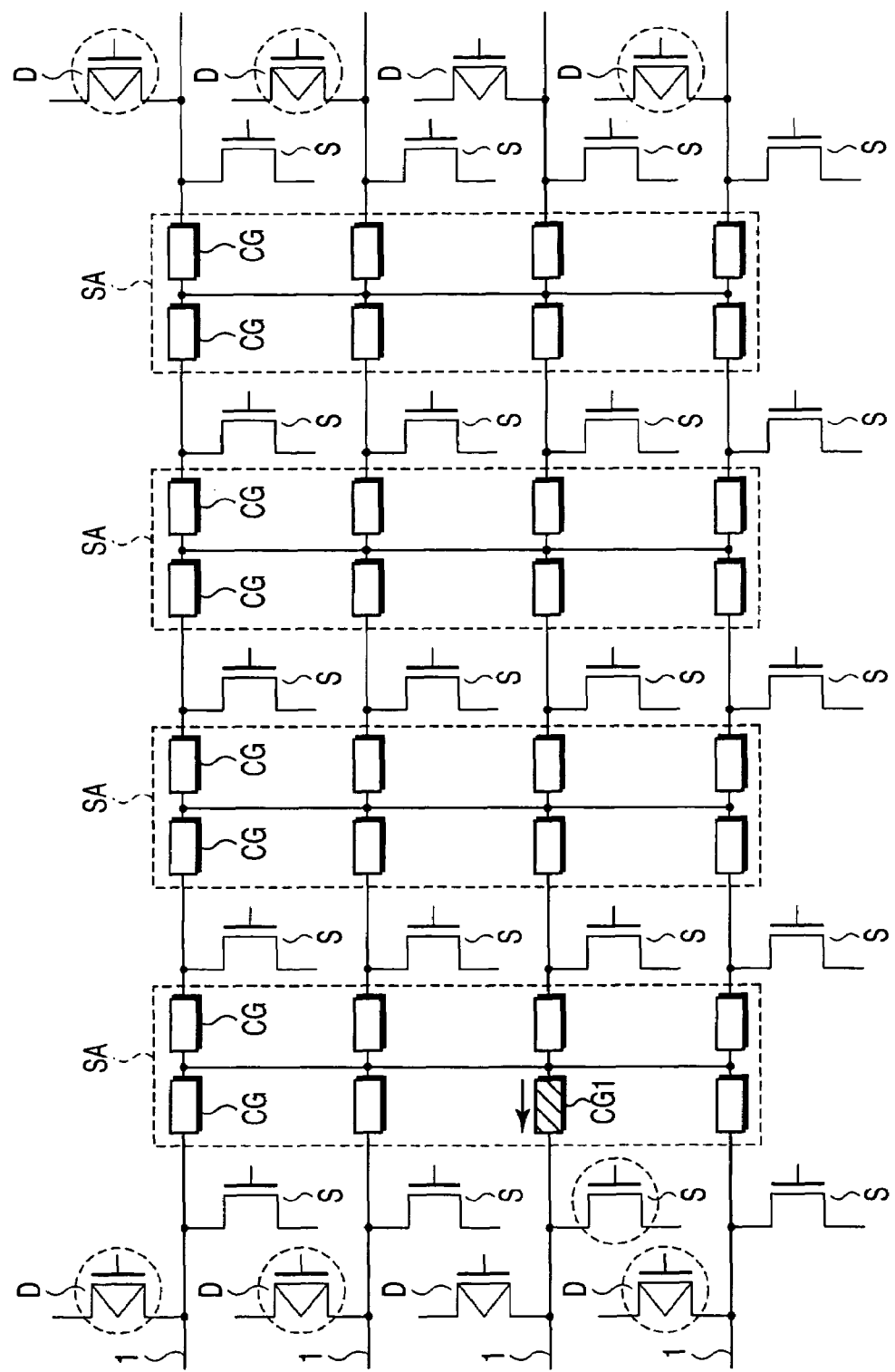
FIG. 10 illustrates a concept of the method of passing the write current through the MRAM of the first embodiment.

Next, a method of how to pass the write current through a required position of each write line 1 in order to apply a magnetic field to a required memory cell of the MRAM of FIG. 1 will be described with reference to FIGS. 9, 10. FIGS. 9 and 10 illustrate a concept of the method of passing the write current through the MRAM according to the first embodiment. An example will be described in which the current is passed through the write line 1 passing through a cell group (hereinafter referred to as the selected cell group) CG1 including a target memory cell MC in FIG. 9. Note that FIG. 9 shows a case where the selected cell group is positioned in a place other than an end of the write line 1. On the other hand, FIG. 10 shows a case where the selected cell group is positioned in the end of the write line 1.

In FIG. 9, one closest sinker S without interposing any connection line LC in the selected cell group is turned on. The other sinkers S remain to be off. In this example, the right cell group is the selected cell group among pairs of cell groups CG positioned on opposite sides of each sinker S. Therefore, at least all of the drivers D in right ends of the write lines 1 are turned on, and the remaining drivers D remain off. The sinker S and the drivers D which are turned on are surrounded with broken lines.

When the sinker S and the drivers D are turned on in this manner, the write currents flow from the respective drivers D into the respective write lines 1. These write currents pass through the connection line LC in the sub-array SA to which the selected cell group CG1 belongs, flow from right to left through a portion of the write line 1 passing through the selected cell group CG1, and flow into the sinker S which has been turned on. The currents which have flown out of the respective drivers D are combined in the portion of the write line 1 passing through the selected cell group CG1, and a current value becomes maximum in this portion. The maximum value current is used to write information into the memory cell MC.

As shown in FIG. 9, all of the drivers can be turned on irrespective of the position of the selected cell group CG1. Consequently, control including decoding is facilitated, and the number of signal lines for the decoding can be reduced. Therefore, this control is more preferable.

In this case, for example, even when the write current is passed through the write line 1 passing through a cell group CG2 adjacent to the cell group CG1 via the turned-on sinker S, the same drivers D and the sinker S as those of FIG. 9 are turned on. The write current flows from left to right through the write line 1 passing through the cell group CG2. Even in the writing of the memory cell MC of the same row, the direction of the current differs in this manner depending on the positional relation between the memory cell MC and the sinker S. Therefore, the direction of the current of the other write line 2 is changed to control information to be written.

In FIG. 10, all of the drivers are turned on other than two drivers D in the opposite ends of the write line 1 which passes through the selected cell group CG1. At least one closest sinker S without interposing any connection line LC in the selected cell group CG1 is turned on. The other sinkers S remain off.

When the sinker S and the drivers D are turned on in this manner, the write currents flow from the respective drivers D into the respective write lines 1. These write currents pass through the connection line LC in the sub-array to which the selected cell group CG1 belongs, flow from right to left through the portion of the write line 1 which passes through the selected cell group, and flows into the turned-on sinker S.

Figure 12:
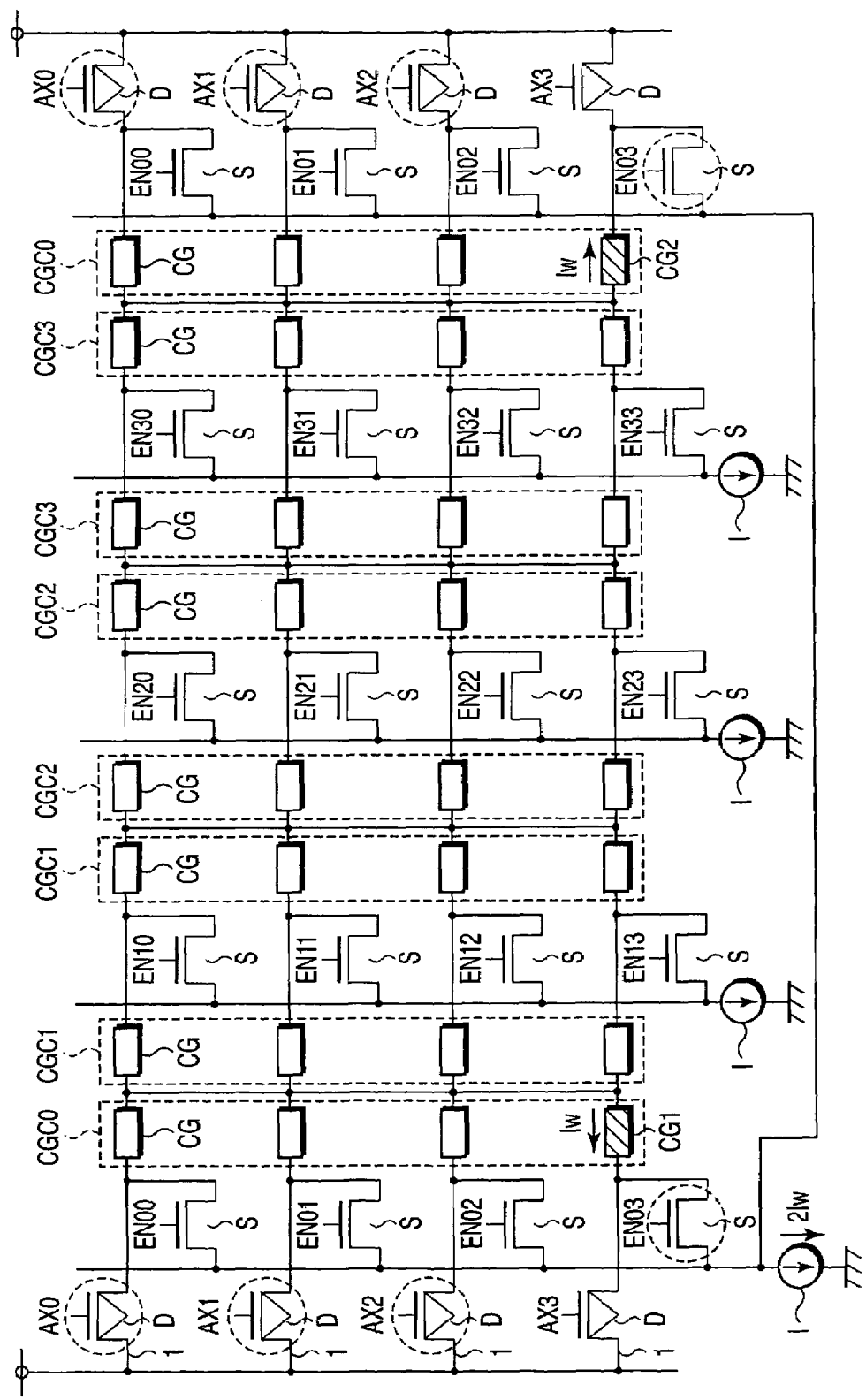
FIG. 12 illustrates a state when writing to the MRAM according to the first embodiment.

Next, an example of a decoding method will be described in the MRAM according to the first embodiment with reference to FIGS. 11 to 13. FIGS. 11, 12 illustrate states when writing in the MRAM according to the first embodiment. FIGS. 11, 12 correspond to a case (FIG. 7) where the constant-current sources I are provided on the side of the sinkers S. How to control is the same even in a case where the constant-current sources I are provided on a driver D side. FIG. 11 shows a case where the cell group CG positioned in a place other than the end of the write line 1 is selected, and FIG. 12 shows a case where the cell group CG positioned in the end of the write line 1 is selected.

As shown in FIGS. 11, 12, the same address signals AX0 to AX3 are supplied to gates of one set of drivers connected to the same write line 1. That is, the addresses AX0 to AX3 are allocated to the write lines 1 in order from above, respectively.

Addresses AC0 to AC3 are allocated in order to decode the sinkers S to every cell groups CG (cell group column CGC) belonging to the same column. The same addresses AC1 to AC3 are allocated to sets CGC1, CGC2, CGC3 each of which includes two cell group columns adjacent to the opposite sides of each sinker S. The same address AC0 is allocated to cell group columns CGC0 in the opposite ends. A signal for selecting the cell group column CGC can be generated using a part of bits of an address signal having several digits for selecting the memory cell MC at a reading time.

Any one of enable signals EN00, EN10, EN20, and EN30 is supplied to each sinker S connected to the write line 1 (write line 1 selected by the address signal AX0) connected to the driver to which the address signal AX0 is supplied. That is, the enable signal EN00 is supplied to the opposite-ends sinkers S. The enable signal EN10 is supplied to the sinker between the cell group columns CGC1. The enable signal EN20 is supplied to the sinker between the cell group columns CGC2. The enable signal EN30 is supplied to the sinker between the cell group columns CGC3.

Similarly, an enable signal ENpq (p, q each is 0 or natural number) is supplied to the sinker connected to the write line 1 selected by an address signal AXq between cell group columns CGCp. An enable signal EN0q is supplied to the sinker S connected to the opposite ends of the write line 1 selected in response to the address signal AXq.

Figure 13:
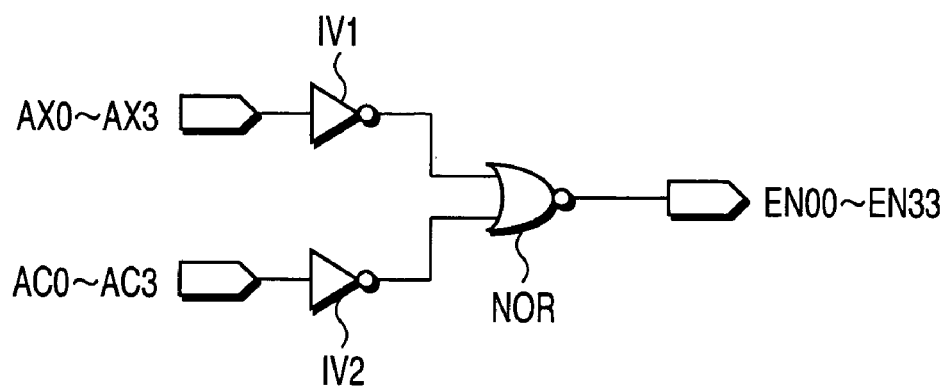
FIG. 13 illustrates a decode circuit for use in the MRAM of the first embodiment.

FIG. 13 illustrates a decode circuit for passing the write current through the write line which passes through a target cell group of the MRAM of FIGS. 11, 12. The decode circuit is provided for each of the sinkers of FIGS. 11, 12. This decode circuit is realized as a part of the decoder 22 of FIG. 1.

As shown in FIG. 13, in each decode circuit, one of inverted address signals AX0 to AX3 is supplied to a first input end of a NOR circuit NOR depending on which sinker S the decode circuit controls. One of inverted address signals AC0 to AC3 is supplied to a second input end of a NOR circuit NOR depending on which sinker S the decode circuit controls. Each NOR circuit NOR outputs one of the enable signals EN00 to EN33 at the output end depending on which sinker S the decode circuit controls.

More specifically, for example, the address signal AC2 and the address signal AX2 are supplied to the decode circuit for decoding the sinker S which is connected to the write line 1 of the address AX2 and which is adjacent to the cell group column of the address AC2. An output of this decode circuit is connected to the gate of the sinker S which is connected to the write line 1 of the address AX2 and which is adjacent to the cell group of the address AC2.

For example, in order to select the cell group CG1 which is specified by the address signal AX2 and the address signal AC2 of FIG. 11, the address signals AX2, AC2 are set to high level, and the address signals AX0, AX1, AX3, AC0, AC1, and AC3 maintain low level. As a result, the sinker S to which an enable signal EN22 is supplied turns on, and the drivers D to which the address signals AX0, AX1, and AX3 are supplied turn on.

Therefore, the write currents flow from the respective write lines 1 through the connection line LC adjacent to the selected cell group CG1, and combined current flows from right to left (along an arrow) through the portion of the write line 1 which passes through the selected cell group CG1. If a value of the write current is assumed to be Iw, all of the constant-current sources I are configured to supply current having a value of 2Iw. As a result, the write current having a value Iw can be passed through the portion of the write line 1 which passes through the selected cell group CG1.

In the example of FIG. 11, the same control is performed, even when the cell group CG2 is selected. As a result, the write current flows from left to right (along an arrow) through the portion of the write line 1 which passes through the cell group CG2. That is, when either of two cell groups CG adjacent to the opposite sides of each sinker S is selected, the same control is performed.

Similarly, in order to select the cell group CG1 which is specified by the address signal AX3 and the address signal AC0 of FIG. 12, the address signals AX3, AC3 are set to the high level, and the address signals AX0, AX1, AX2, AC0, AC1, and AC2 maintain the low level. As a result, the sinker S to which an enable signal EN03 is supplied turns on, and the drivers D to which the address signals AX0, AX1, and AX2 are supplied turn on.

Therefore, the write currents flow from the respective write lines 1 through the connection line LC adjacent to the selected cell group CG1, and combined current flows from right to left (along an arrow) through the portion of the write line 1 which passes through the selected cell group CG1. As described above, since all of the constant-current sources I are configured to supply a current having a value of 2Iw, the write current having a value Iw flows through the portion of the write line 1 which passes through the selected cell group CG1.

Under this control, the sinker S connected to the other end of the write line 1 also turns on. As a result, the write current flows from left to right (along an arrow) through the portion of the write line 1 which passes through the cell group CG2. That is, in a case where the cell group CG in the end of the write line 1 is selected, the sinkers S in the opposite ends of this write line 1 simultaneously turn on.

The aforementioned control allows the respective constant-current sources to be operated at an equal ampere value. Therefore, controlling and designing of the MRAM are facilitated.

Figure 14:
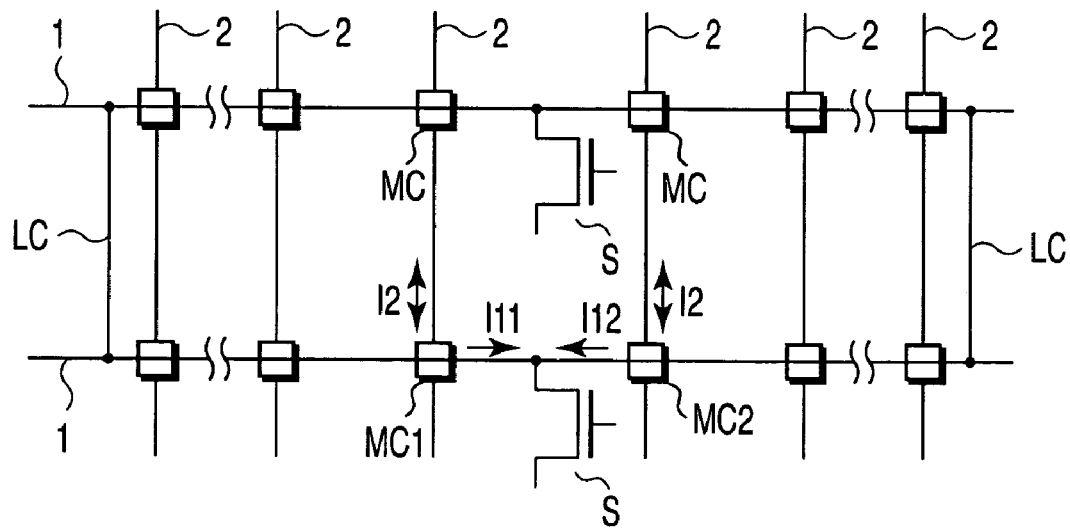
FIG. 14 shows a direction of the write current of the MRAM according to the first embodiment.
Figure 15:
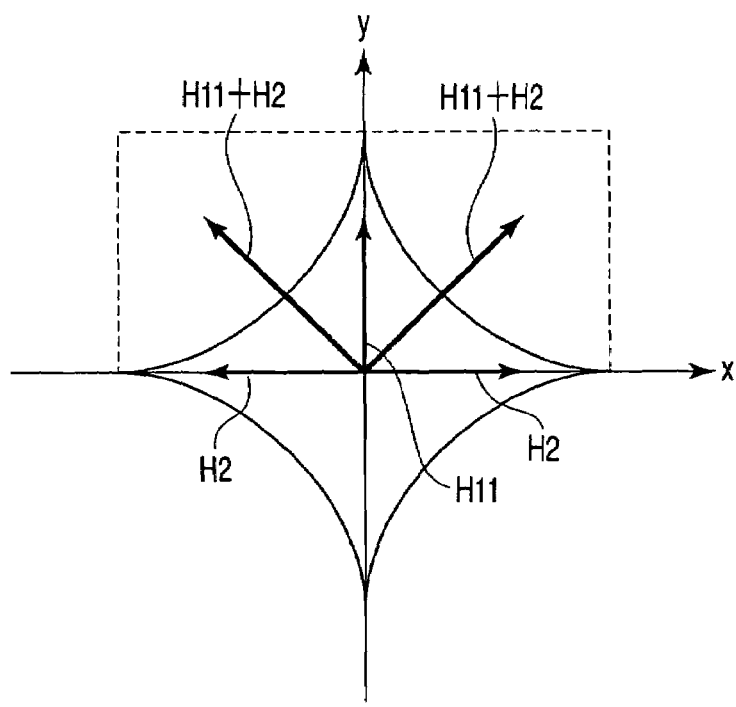
FIG. 15 shows an asteroid curve of a memory cell when the write current flows from left to right through the write line.
Figure 16:
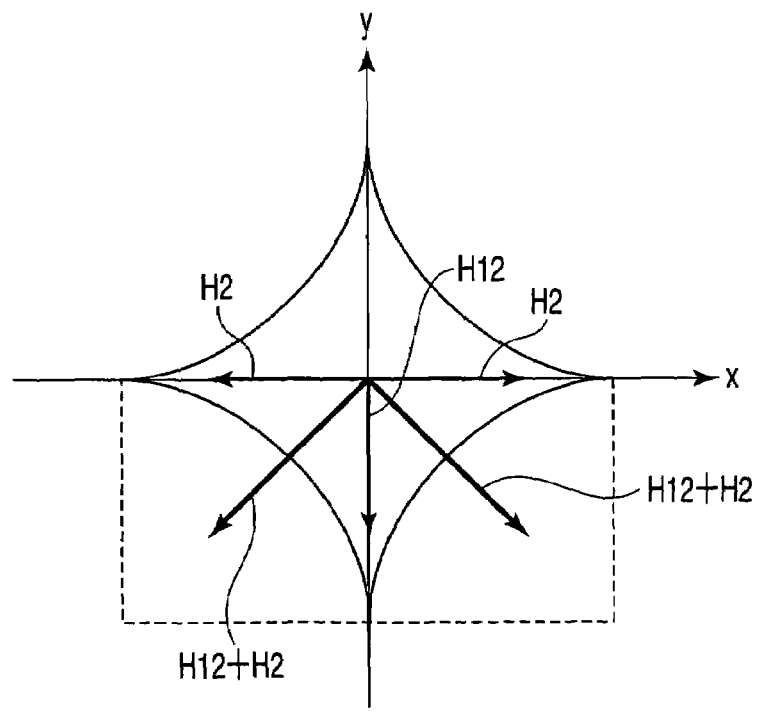
FIG. 16 shows an asteroid curve of the memory cell when the write current flows from right to left through the write line.

Next, a method of writing required information into a target memory cell will be described with reference to FIGS. 14 to 16. FIG. 14 shows a direction of the write current of the MRAM according to the first embodiment. FIG. 15 shows an asteroid curve of the memory cell in a case where the write current flows from left to right through the write line 1. FIG. 16 shows an asteroid curve of the memory cell in a case where the write current flows from right to left through the write line 1.

The current flowing through the write line 1 flows only in one fixed direction depending on the position of the memory cell MC, in more detail, a positional relation between the cell group CG to which the memory cell MC belongs and the sinker S closest to the cell group CG. That is, as shown in FIG. 14, a write current I11 flows from left to right through the write line 1 in the memory cell MC on the left side of the sinker S. On the other hand, a write current I12 flows from right to left through the write line 1 in the memory cell MC on the right side of the sinker S. Therefore, the direction of a write current I2 flowing through the write line 2 is controlled to write required binary information.

In order to write information into the memory cell (e.g., memory cell MC1) on the left side of the sinker S, a magnetic field having a direction shown in FIG. 15 is applied. That is, the current I11 generates a magnetic field H11 in a positive direction of a Y-axis (hard magnetization axis direction), and the current I2a generates magnetic field H2 in a positive or negative direction of an X-axis (easy magnetization axis direction). Therefore, during writing, a synthesized magnetic field H11+H2 generated in first and second quadrants is used.

On the other hand, in order to write information into the memory cell (e.g., memory cell MC2) on the right side of the sinker S, a magnetic field having a direction shown in FIG. 16 is applied. That is, the current I12 generates a magnetic field H12 in the negative direction of the Y-axis, and the current I2 generates the magnetic field H2 in the positive or negative direction of the X-axis. Therefore, during writing, a synthesized magnetic field H12+H2 generated in third and fourth quadrants is used.

As described above, a pair of quadrants in which the synthesized magnetic field used for writing in one MRAM varies depending on memory cells. In a general MRAM, since the direction of the current flowing through one of two write lines is pinned in one direction, the pair of quadrants in which the synthesized magnetic field is positioned are the same in all of the memory cells.

According to the MRAM of the first embodiment, sub-arrays each including the memory cells MC and write lines 1 connected to one another via the connection line LC are connected to one another and the sinkers and the drivers are connected between the sub-arrays SA and to the opposite ends of the write line 1. This configuration can pass through the required position of the write line 1 even when the sub-arrays SA are connected to one another. Therefore, when the currents are supplied from drivers D to write lines 1 connected to one another, a wiring resistance of a write current path can be reduced. Furthermore, sub-arrays can be connected to one another, which can achieve a large cell array. As a result, the MRAM having a high integrating degree can be realized.

Second Embodiment

In the first embodiment, the sinkers are provided inside the memory cell array, and the drivers are provided outside the memory cell array. In a second embodiment, drivers are provided inside a memory cell array, and sinkers are provided outside the memory cell array.

Figure 17:
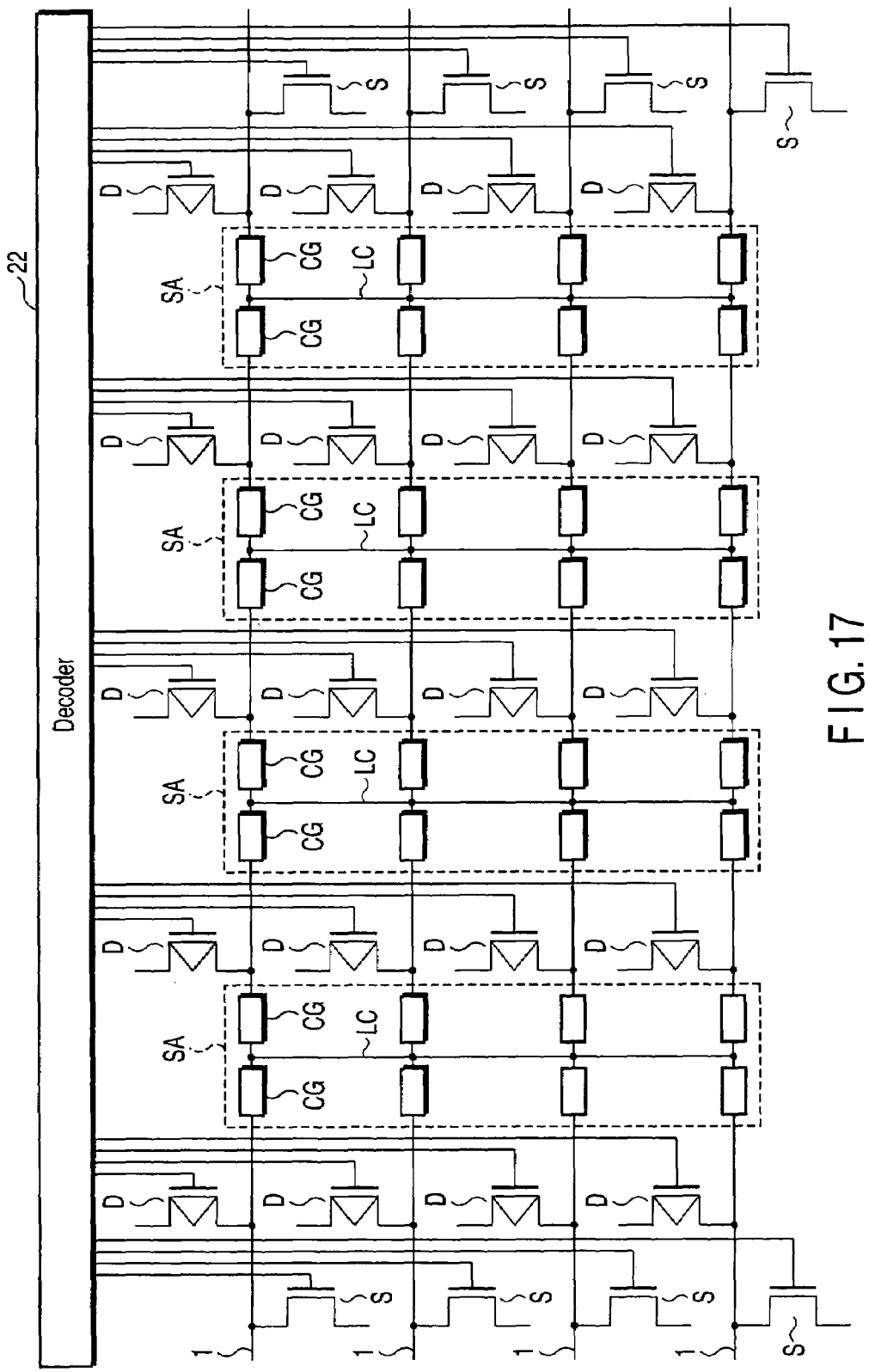
FIG. 17 schematically shows a constitution of the MRAM according to a second embodiment of the present invention.

FIG. 17 schematically shows a constitution of a magnetic random access memory according to the second embodiment of the present invention. FIG. 17 shows write lines 1 only in the same manner as in FIG. 1, and another write line 2, and a driver/sinker, decoder 21 are omitted in the same manner as in FIG. 2.

As shown in FIG. 17, for example, one end of a driver D constituted of a p-type MOS transistor is connected to each write line 1 between sub-arrays SA. Opposite ends of each write line 1 are connected to one end of each driver D. The other end of each driver D is connected to a power potential supply end or a constant-current source as described later.

The opposite ends of the write line 1 are connected to sinkers constituted, for example, of n-type MOS transistors. The other end of each sinker S is grounded or connected to the constant-current source as described later. The sinkers S and the drivers D turn on/off in response to control signals from a decoder 22. The other constitution is the same as that of the first embodiment (FIG. 1).

Figure 18:
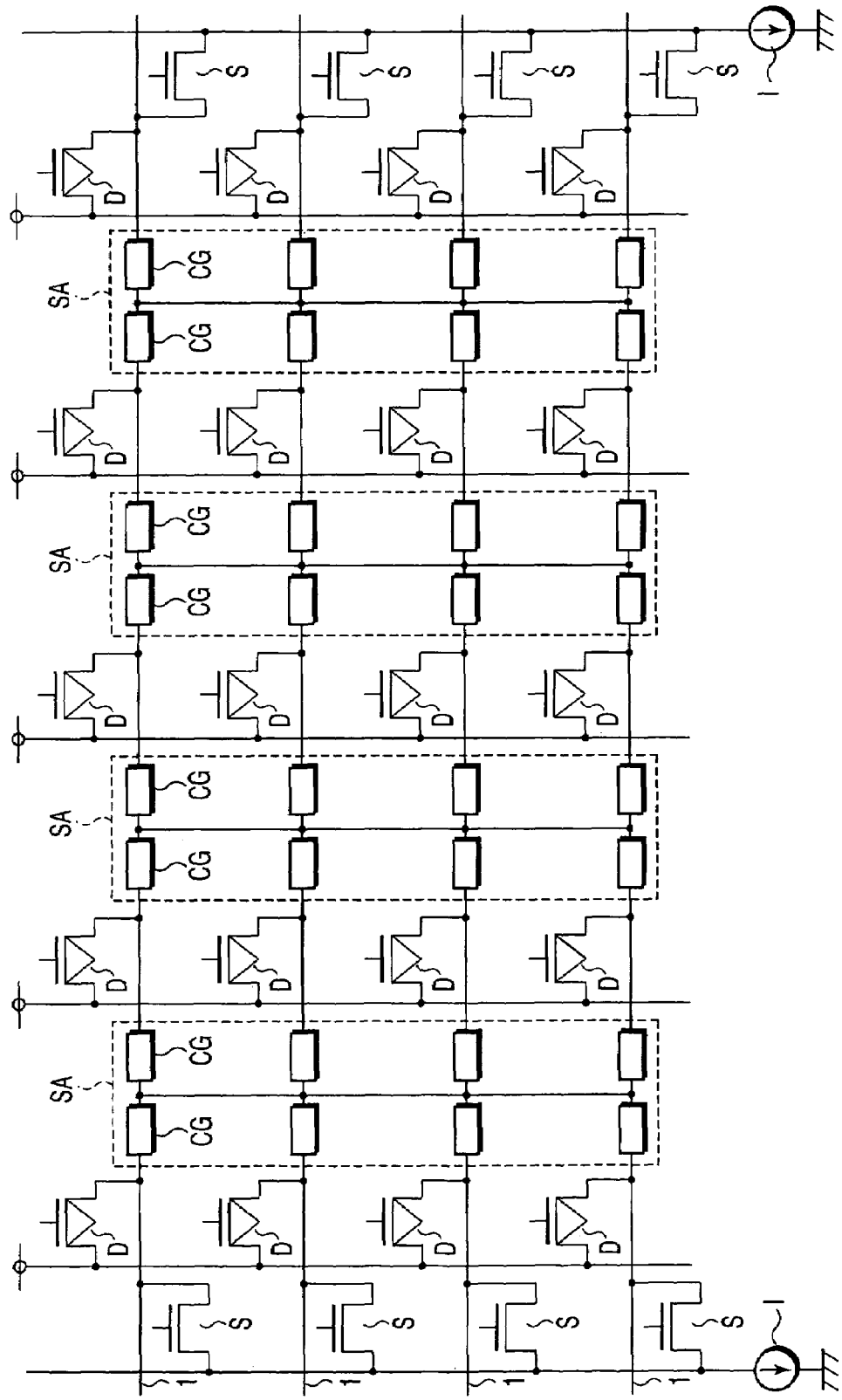
FIG. 18 shows an example in which the constant-current sources are provided on the sinker side in the MRAM of the second embodiment.
Figure 19:
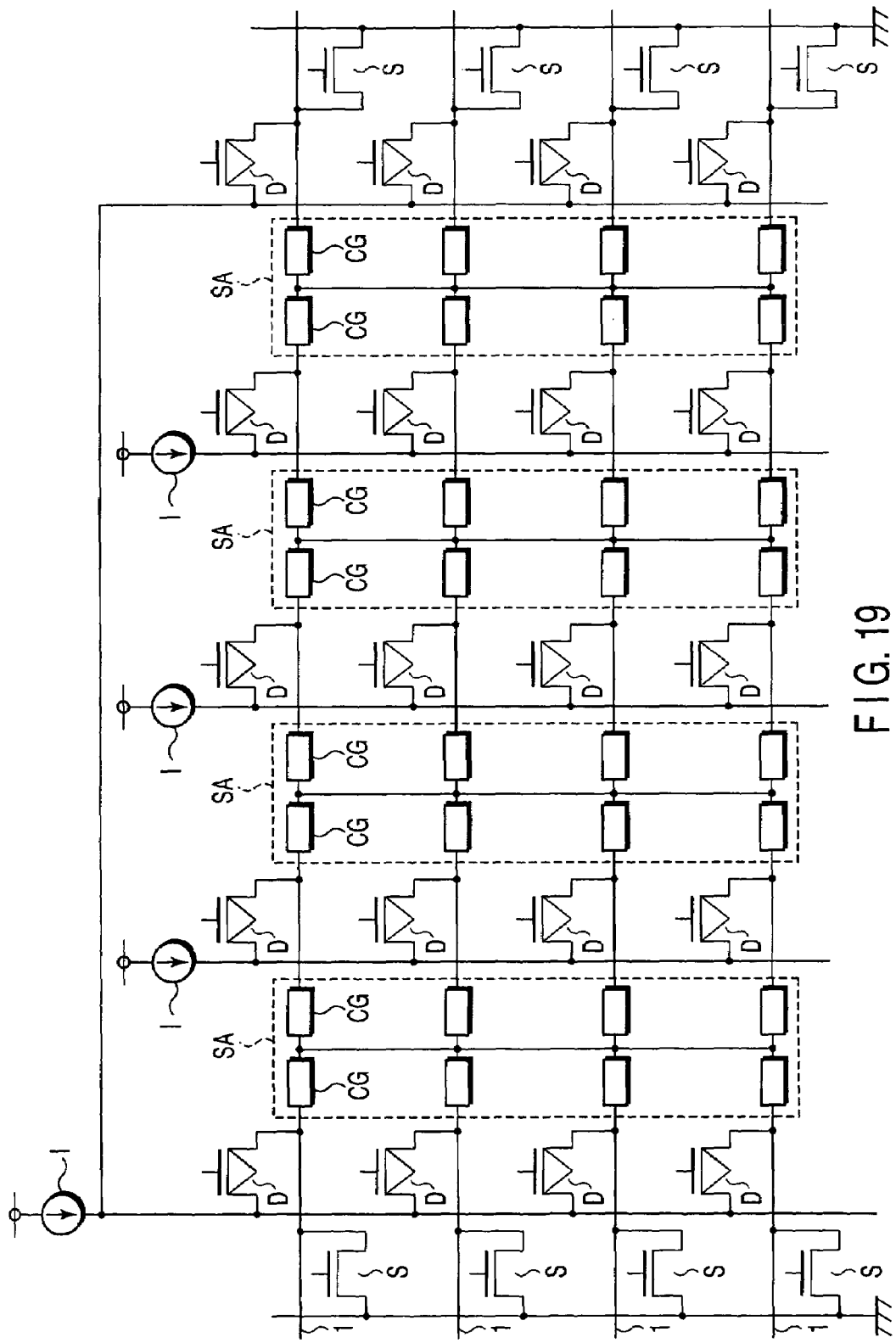
FIG. 19 shows an example in which the constant-current sources are provided on the driver side in the MRAM of the second embodiment.

As shown in FIGS. 18, 19, the other end of each driver D or each sinker S is connected to the constant-current source. FIG. 18 shows an example in which the constant-current sources are provided on a sinker side in the MRAM according to the second embodiment. As shown in FIG. 18, an end of each sinker S opposite to the write line 1 is grounded via a constant-current source I. An end of each driver D opposite to the write line 1 is connected to the power potential supply end.

FIG. 19 shows an example in which the constant-current sources are provided on a driver side in the MRAM according to the second embodiment. As shown in FIG. 19, the end of each driver D opposite to the write line 1 is connected to the power potential supply end via the constant-current source. The end of each sinker S opposite to the write line 1 is connected to a common potential end.

Figure 20:
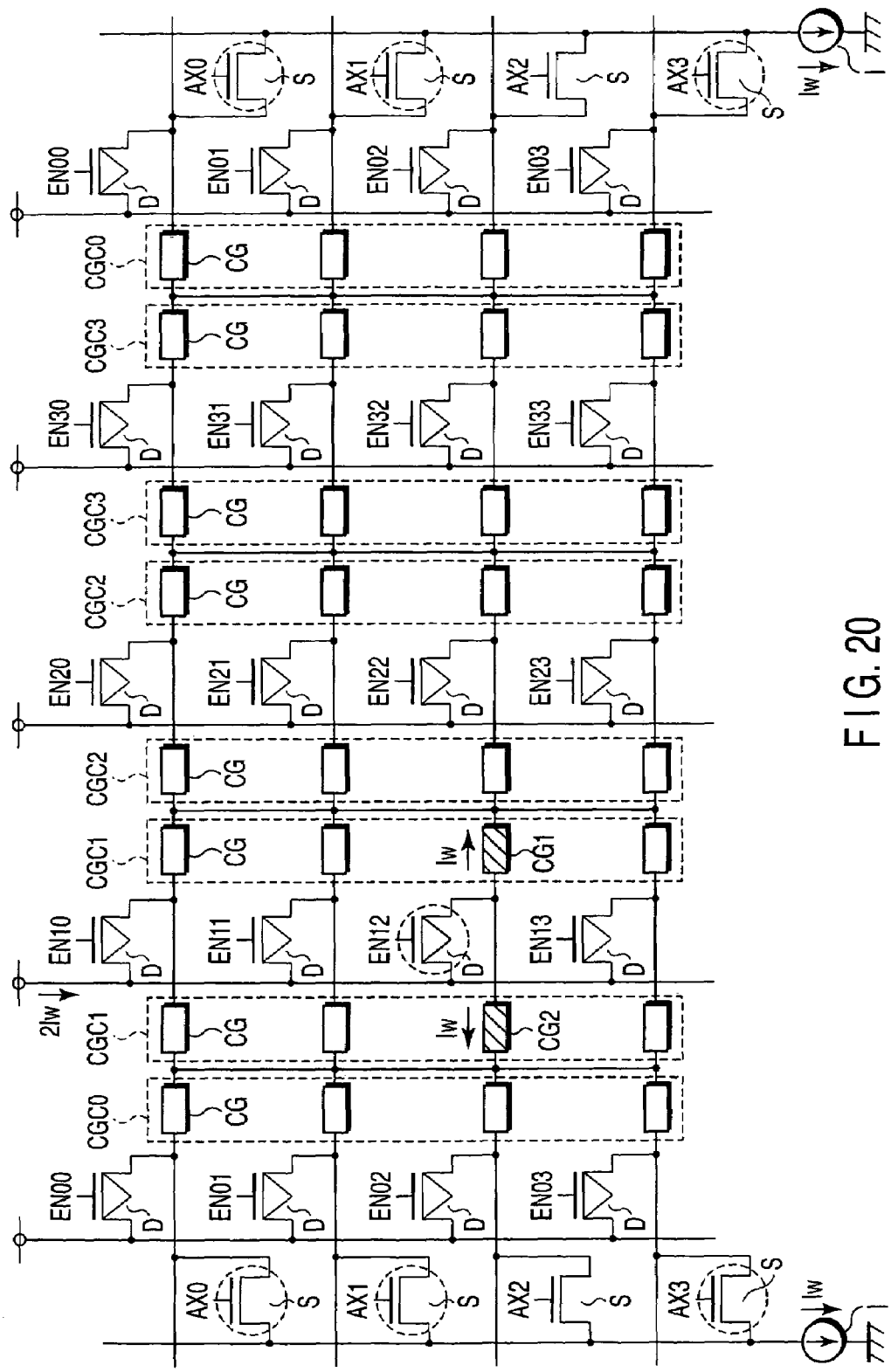
FIG. 20 illustrates a state when writing to the MRAM according to the second embodiment.
Figure 21:
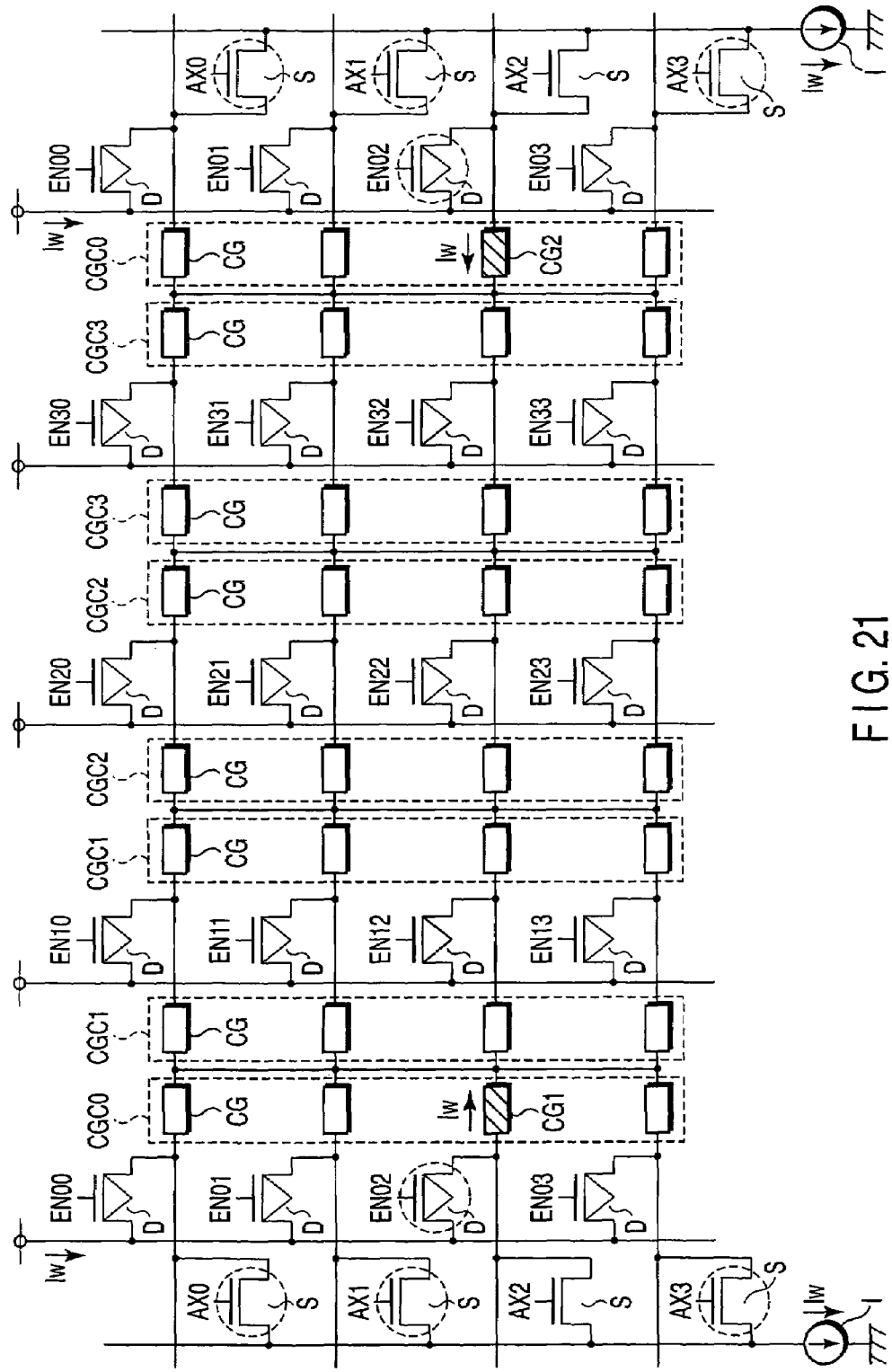
FIG. 21 illustrates a state when writing to the MRAM according to the second embodiment.

Next, one example of a decoding method will be described in the MRAM according to the second embodiment with reference to FIGS. 20, 21. FIGS. 20, 21 illustrate states when writing in the MRAM according to the second embodiment. This example corresponds to a case (FIG. 18) where the constant-current sources I are provided on the sinker side. Even when the constant-current sources I are provided on the driver side, a control method is the same. FIG. 20 shows a case where a cell group CG positioned in a place other than an end of the write line 1 is selected, and FIG. 21 shows a case where the cell group CG positioned in the end of the write line 1 is selected.

Address signals AX0 to AX3 are supplied to gates of a set of sinkers S connected to the same write line 1 in the same manner as in the first embodiment. In the same manner as in the first embodiment, an enable signal ENpq is supplied to the driver D connected to the write line 1 selected by an address signal AXq between cell group columns CGCp. An enable signal EN0q is supplied to the driver D connected to the opposite ends of the write line 1 selected in response to the address signal AXq.

The same decode circuit (FIG. 13) as that of the first embodiment can be used. An output of each decode circuit is connected to the corresponding gate of the driver D.

For example, in a case where cell groups CG1, CG2 are selected which are specified by the address signal AX2 and an address signal AC1 of FIG. 20, the address signals AX2, AC1 are set to high level, and address signals AX0, AX1, AX3, AC0, AC2, and AC3 maintain low level. As a result, the driver D to which an enable signal EN12 is supplied turns on, and the sinkers S to which the address signals AX0, AX1, and AX3 are supplied turn on. The write currents which have flown in via one end of the turned-on driver D flow from right to left and from left to right through portions of the write line 1 which passes through the selected cell groups CG1, CG2, respectively. Next, the current flows out to other write lines 1 via a connection line LC connected to ends of the selected cell groups CG1, CG2.

All of the constant-current sources I are configured to extract a current having a value of Iw. As a result, a current having a value of 2Iw flows through the selected driver D. This current is branched, and a write current having a value of Iw flows through the portions of the write line 1 which passes through the respective selected cell groups.

Similarly, when cell groups CG1, CG2 are selected which are specified by the address signal AX2 and an address signal AC0 of FIG. 21, the address signals AX2, AC0 are set to high level, and address signals AX0, AX1, AX3, AC1, AC2, and AC3 maintain low level. As a result, the driver D to which an enable signal EN02 is supplied turns on, and the sinkers S to which the address signals AX0, AX1, and AX3 are supplied turn on. The write currents which have flown in via one end of the turned-on driver D flow from left to right or from right to left through the portions of the write line 1 which passes through the selected cell groups CG1, CG2, respectively. The current flows out to other write lines 1 via a connection line LC connected to ends of the selected cell groups CG1, CG2.

As described above, since all of the constant-current sources I are configured to extract a current having a value of Iw, a write current having a value of Iw flows through two turned-on drivers D. As a result, a write current having a value of Iw flows through the write line 1 which passes through the respective selected cell groups.

A direction of a current I2 of the write line 2 (not shown) is controlled during the writing in the same manner as in the first embodiment in order to write required binary information. Therefore, a pair of quadrants in which an applied synthesized magnetic field is positioned varies depending on memory cells.

The same advantageous effects as those of the first embodiment are obtained even in the MRAM according to the second embodiment.

Third Embodiment

In the first and second embodiments, one of the driver D and the sinker S is connected to an end of the write line 1. In a third embodiment, each driver D is connected to opposite ends of each connection line.

Figure 22:
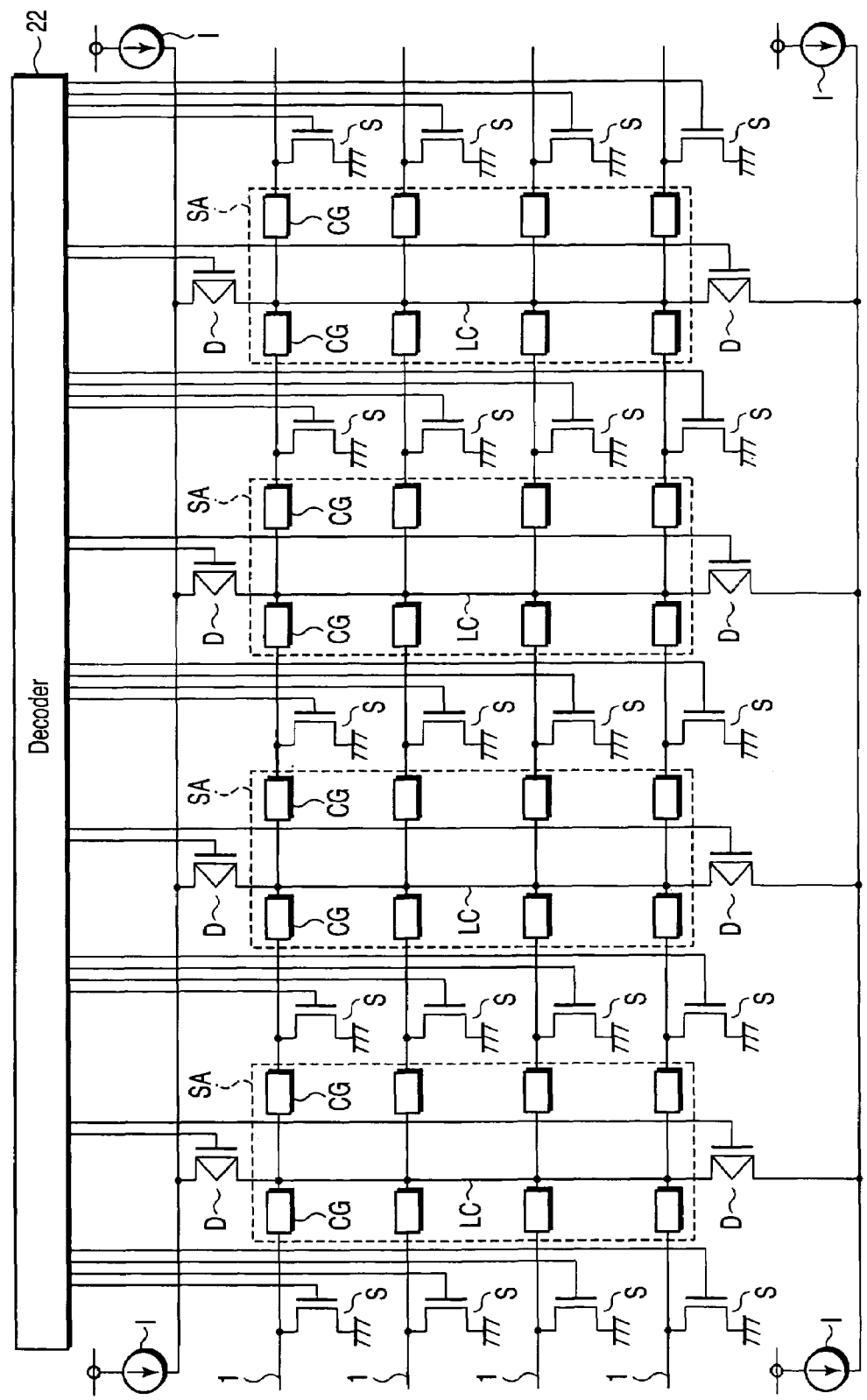
FIG. 22 schematically shows a constitution of the MRAM according to a third embodiment of the present invention.

FIG. 22 schematically shows a constitution of a magnetic random access memory according to the third embodiment of the present invention. FIG. 22 shows write lines 1 only in the same manner as in FIG. 1, and another write line 2, and a driver/sinker, decoder 21 are omitted in the same manner as in FIG. 2.

As shown in FIG. 22, for example, one end of each connection line LC is connected to a common line via the driver D constituted of a p-type MOS transistor. Constant-current sources I are connected to opposite ends of the common line, respectively. The other end of each connection line LC is also connected to a common line via the driver. The constant-current sources I are also connected to the opposite ends of this common line, respectively. An end of each sinker opposite to the write line 1 is connected to a common potential end.

The sinkers S and the drivers D turn on/off in response to control signals from a decoder 22. The other constitution is the same as that of the first embodiment (FIG. 1).

Figure 23:
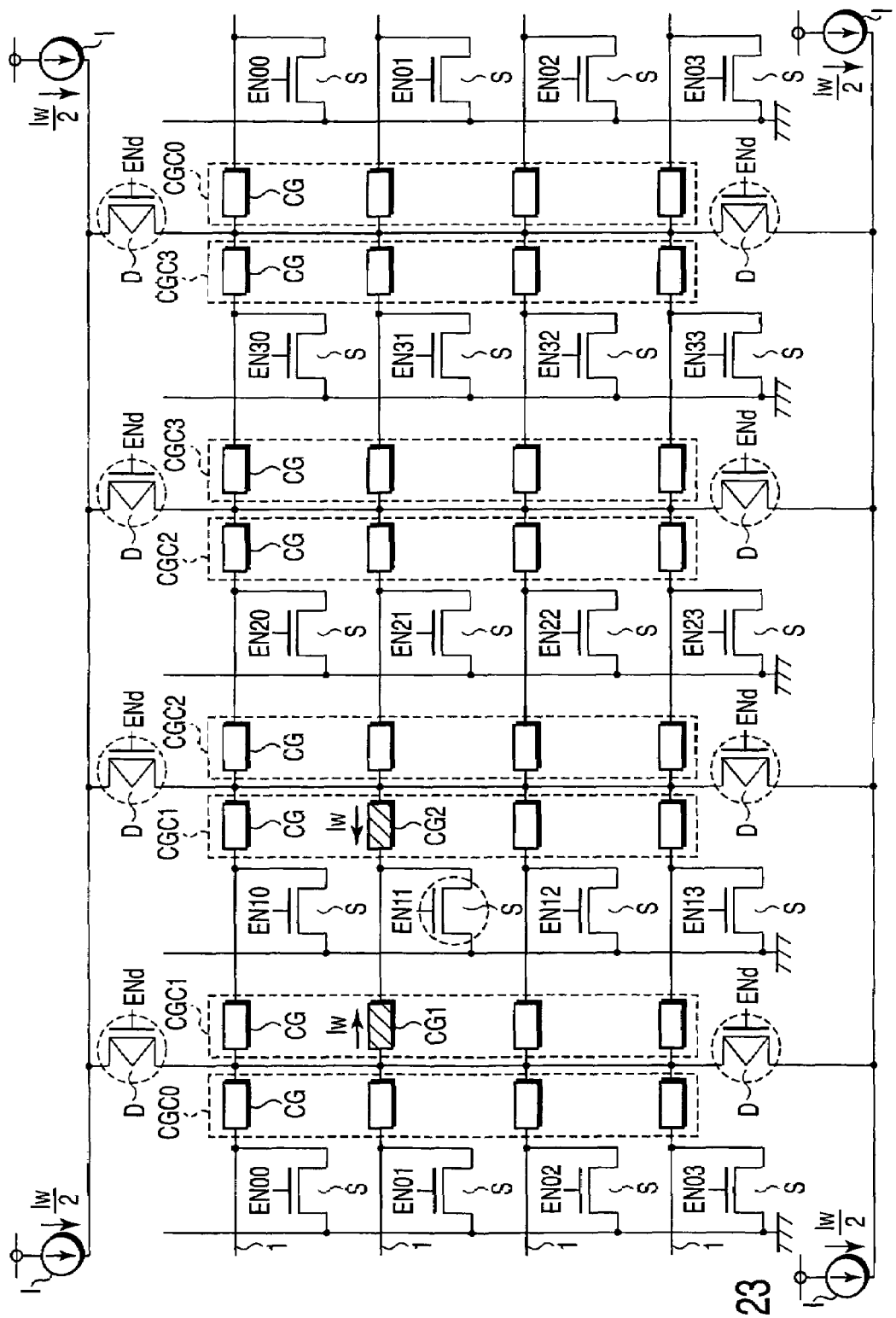
FIG. 23 illustrates a state when writing to the MRAM according to the third embodiment.
Figure 24:
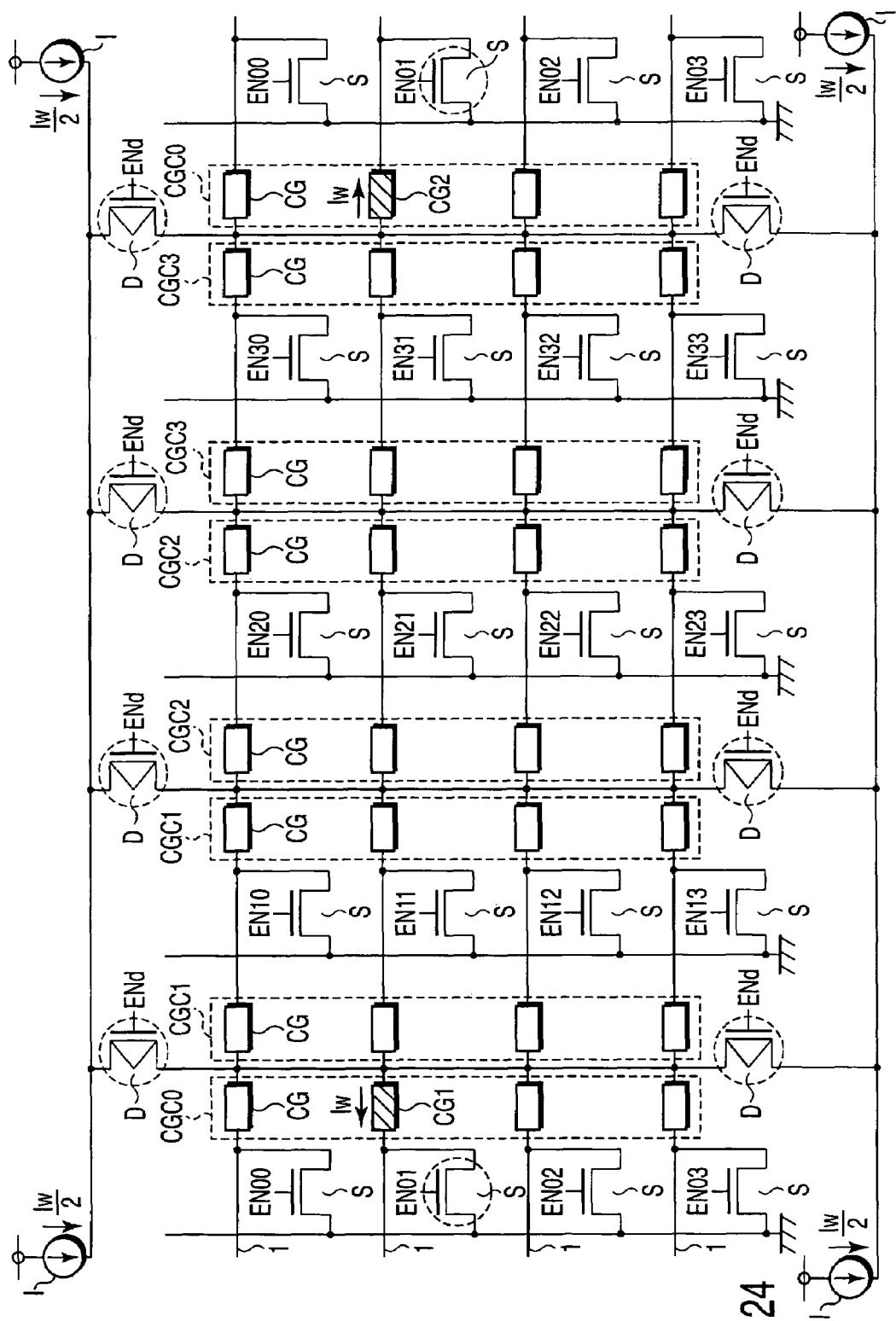
FIG. 24 illustrates a state when writing to the MRAM according to the third embodiment.

Next, one example of a decoding method will be described in the MRAM according to the third embodiment with reference to FIGS. 23 and 24. FIGS. 23, 24 illustrate states when writing in the MRAM according to the third embodiment. FIG. 23 shows a case where a cell group CG positioned in a place other than an end of the write line 1 is selected, and FIG. 24 shows a case where the cell group CG positioned in the end of the write line 1 is selected.

The decoding method for a sinker for passing a write current through a portion of the write line 1 which passes through a target cell group CG is the same as that of the first embodiment. The present embodiment differs in that enable signals ENd are supplied to all of the drivers D irrespective of the selected cell group CG, and all of the drivers D turn on during passing of the write current. Therefore, the same decode circuit as that of the first embodiment is used as a decode circuit for decoding the sinkers.

For example, in order to select cell groups CG1, CG2 which are specified by an address signal AX1 and an address signal AC1 of FIG. 23, the sinker to which an enable signal EN11 is supplied turns on by the same method as that of the first embodiment, and all of the drivers D turn on. As a result, currents flow from all of constant-current sources I through the drivers D, connection lines LC, and the write lines 1. Each half of total of these currents flows from left to right or from right to left through portions of the write line 1 which passes through the selected cell groups CG1, CG2, respectively. All of the constant-current sources I are configured to supply a current having a value of Iw/2. As a result, a value of the write current flowing through the portion of the write line 1 passing through each selected cell group CG can be set to Iw.

Similarly, in order to select cell groups CG1, CG2 which are specified by an address signal AX1 and an address signal AC1 of FIG. 24, the sinker to which an enable signal EN01 is supplied turns on by the same method as that of the first embodiment, and all of the drivers D turn on. As a result, each half of total currents flowing from all of constant-current sources I through the drivers D, the connection lines LC, and the write lines 1 flows from left to right or from right to left through portions of the write line 1 which passes through the selected cell groups CG1, CG2, respectively. Since all of the constant-current sources I are configured to supply a current having a value of Iw/2, a value of the write current flowing through the portion of the write line 1 passing through each selected cell group CG can be set to Iw.

A direction of a current I2 of the write line 2 (not shown) is controlled during the writing in the same manner as in the first embodiment in order to write required binary information. Therefore, a pair of quadrants in which an applied synthesized magnetic field is positioned varies depending on memory cells.

The same advantageous effects as those of the first embodiment are obtained even in the MRAM according to the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   first write lines separated from one another and extending along a first direction;
   second write lines extending in a direction different from the first direction;
   MTJ elements provided between the first write lines and the second write lines;
   connection lines connecting the first write lines; sinkers connected to ends of the first write lines, connected to the first write lines at between the connection lines and extracting currents from the first write lines; and
   drivers connected to ends of the first write lines and supplying currents to the first write lines.

2. The memory according to claim 1, wherein the sinkers or the drivers comprise a switching element whose one end is connected to one of the first write lines and whose another end is connected to a constant-current source or a common potential.

3. The memory according to claim 1, wherein one selected MTJ element is selected from the MTJ elements,
   two non-selected drivers, among the drivers, connected to one of the first write lines passing the selected MTJ element are turned off,
   at least one of the drivers other than the non-selected drivers is turned on,
   one selected sinker, among the sinkers, which is closest to the selected MTJ element without interposing any one of the connection lines is turned on, and
   the sinkers other than the selected sinker are all turned off.

4. The memory according to claim 3, wherein when the selected sinker is connected to one end of the one of the first write lines passing the selected MTJ element, one of the sinkers connected to another end of the one of the first write lines is turned on.

5. The memory according to claim 1, wherein a synthesized magnetic field is applied to the MTJ elements upon writing, a direction of the synthesized magnetic field is set along one of two directions depending on data to be written, and a set comprising the two directions varies depending on the MTJ elements.

6. A magnetic random access memory comprising:
   first write lines separated from one another and extending along a first direction;
   second write lines extending in a direction different from the first direction;
   MTJ elements provided between the first write lines and the second write lines;
   connection lines connecting the first write lines;
   drivers connected to ends of the first write lines and to the first write lines at between the connection lines and supplying currents to the first write lines; and
   sinkers connected to ends of the first write lines and extracting currents from the first write lines.

7. The memory according to claim 6, wherein the drivers or the sinkers comprise a switching element whose one end is connected to one of the first write lines and whose another end is connected to a constant-current source or a common potential.

8. The memory according to claim 6, wherein one selected MTJ element is selected from the MTJ elements,
two non-selected sinkers, among the sinkers, connected to one of the first write lines passing the selected MTJ element are turned off,
at least one of the sinkers other than the non-selected sinkers is turned on,
one selected driver, among the drivers, which is closest to the selected MTJ element without interposing any one of the connection lines is turned on, and
the drivers other than the selected driver are all turned off.

9. The memory according to claim 8, wherein when the selected driver is connected to one end of the one of the first write lines passing the selected MTJ element, one of the drivers connected to another end of the one of the first write lines is turned on.

10. The memory according to claim 6, wherein a synthesized magnetic field is applied to the MTJ elements upon writing, a direction of the synthesized magnetic field is set along one of two directions depending on data to be written, and a set comprising the two directions varies depending on the MTJ elements.

11. A magnetic random access memory comprising:
first write lines separated from one another and extending along a first direction;
second write lines extending in a direction different from the first direction;
MTJ elements provided between the first write lines and the second write lines;
connection lines connecting the first write lines;
sinkers connected to ends of the first write lines and to the first write lines at between the connection lines and extracting currents from the first write lines; and
drivers connected to the connection lines and supplying currents to the first write lines.

12. The memory according to claim 11, wherein the drivers comprise a switching element whose one end is connected to the connection line and whose another end is connected to a constant-current source.

13. The memory according to claim 11, wherein one selected MTJ element is selected from the MTJ elements,
at least one of the drivers is turned on,
one selected sinker, among the sinkers, which is closest to the selected MTJ element without interposing any one of connection lines is turned on, and
the sinkers other than the selected sinker are all turned off.

14. The memory according to claim 13, wherein when the selected sinker is connected to one end of one of the first write lines passing the selected MTJ element, one of the sinkers connected to another end of the one of the first write lines is turned on.

15. The memory according to claim 11, wherein a synthesized magnetic field is applied to the MTJ elements upon writing, a direction of the synthesized magnetic field is set along one of two directions depending on data to be written, and a set comprising the two directions varies depending on the MTJ elements.

16. The memory according to claim 1, wherein the first write lines are electrically connected via the connection lines without a switching element.

17. The memory according to claim 1, wherein:
the MTJ elements are placed in a matrix to form sub-arrays, and
sinkers are connected to the first write lines between the sub-arrays.

18. The memory according to claim 6, wherein the first write lines are electrically connected via the connection lines without a switching element.

19. The memory according to claim 6, wherein:
the MTJ elements are placed in a matrix to form sub-arrays, and
drivers are connected to the first write lines between the sub-arrays.

20. The memory according to claim 11, wherein the first write lines are electrically connected via the connection lines without a switching element.

* * * * *